(12) United States Patent
Bradley et al.

(10) Patent No.: US 10,084,425 B2
(45) Date of Patent: Sep. 25, 2018

(54) ACOUSTIC RESONATOR STRUCTURE HAVING COMPRISING A PLURALITY OF CONNECTION-SIDE CONTACTS

(71) Applicant: Avago Technologies General IP (Singapore) Pte. Ltd., Singapore (SG)

(72) Inventors: Paul Bradley, Los Altos, CA (US); Robert Thalhammer, Munich (DE); Thomas Faust, Munich (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 506 days.

(21) Appl. No.: 14/725,176

(22) Filed: May 29, 2015

(65) Prior Publication Data

US 2016/0352306 A1 Dec. 1, 2016

(51) Int. Cl.
*H03H 9/17* (2006.01)
*H03H 9/02* (2006.01)
*H03H 9/205* (2006.01)

(52) U.S. Cl.
CPC ........ *H03H 9/02118* (2013.01); *H03H 9/173* (2013.01); *H03H 9/205* (2013.01)

(58) Field of Classification Search
CPC .... H03H 9/02118; H03H 9/173; H03H 9/205; H01L 41/083; H01L 41/047
USPC ................................................. 310/321, 365
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 5,910,756 A | 6/1999 | Ella |
| 6,107,721 A | 8/2000 | Lakin |
| 6,262,637 B1 | 7/2001 | Bradley et al. |
| 6,507,983 B1 | 1/2003 | Ruby et al. |
| 6,828,713 B2 | 12/2004 | Bradley et al. |
| 7,280,007 B2 | 10/2007 | Feng et al. |
| 7,345,410 B2 | 3/2008 | Grannen et al. |
| 7,388,454 B2 | 6/2008 | Ruby et al. |
| 7,561,009 B2 | 7/2009 | Larson et al. |
| 7,629,865 B2 | 12/2009 | Ruby et al. |
| 7,714,684 B2 | 5/2010 | Ruby et al. |
| 7,791,434 B2 | 9/2010 | Fazzio et al. |
| 7,795,692 B2 | 9/2010 | Lee et al. |
| 8,188,810 B2 | 5/2012 | Fazzio et al. |
| 8,230,562 B2 | 7/2012 | Fazzio et al. |
| 8,248,185 B2 | 8/2012 | Choy et al. |
| 8,384,497 B2 | 2/2013 | Zhang |
| 8,692,631 B2 | 4/2014 | Zhang |
| 8,902,023 B2 | 12/2014 | Choy et al. |
| 2007/0205850 A1 | 9/2007 | Jamneala et al. |
| 2011/0180391 A1* | 7/2011 | Larson, III ............ C23C 14/022 204/192.18 |
| 2011/0266925 A1 | 11/2011 | Ruby et al. |

(Continued)

OTHER PUBLICATIONS

Co-pending U.S. Appl. No. 14/161,564, filed Jan. 22, 2014.

(Continued)

*Primary Examiner* — Bryan Gordon

(57) ABSTRACT

An acoustic resonator comprises a first electrode and second electrode comprising a plurality of sides. At least one of the sides of the second electrode comprises a cantilevered portion. A piezoelectric layer is disposed between the first and second electrodes. A bridge is disposed adjacent to one of the sides of the second electrode.

25 Claims, 8 Drawing Sheets

(56) References Cited

U.S. PATENT DOCUMENTS

| | | | |
|---|---|---|---|
| 2012/0177816 A1 | 7/2012 | Larson, III et al. | |
| 2012/0218060 A1* | 8/2012 | Burak | H03H 3/04 333/191 |
| 2012/0326807 A1 | 12/2012 | Choy et al. | |
| 2013/0015747 A1 | 1/2013 | Ruby et al. | |
| 2013/0038408 A1 | 2/2013 | Burak et al. | |
| 2013/0049545 A1* | 2/2013 | Zou | H03H 3/04 310/346 |
| 2013/0278356 A1 | 10/2013 | Meltaus et al. | |
| 2014/0125203 A1* | 5/2014 | Choy | H03H 9/02118 310/365 |
| 2014/0225682 A1 | 8/2014 | Burak et al. | |

OTHER PUBLICATIONS

Co-pending U.S. Appl. No. 13/662,460, filed Oct. 27, 2012.
Co-Pending U.S. Appl. No. 13/906,873, filed May 31, 2013
Co-Pending U.S. Appl. No. 14/191,771, filed Feb. 27, 2014.
Sumy Jose, "Reflector stack optimization for Bulk Acoustic Wave resonators", 2011.
Tuomas Pensala, "Thin Film Bulk Acoustic Wave Devices: Performance Optimization and Modeling", VTT Publications 756, Feb. 25, 2011.

* cited by examiner

ACOUSTIC RESONATOR STRUCTURE HAVING COMPRISING A PLURALITY OF CONNECTION-SIDE CONTACTS

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

Various types of filters use mechanical resonators, such as bulk acoustic wave (BAW) resonators, including film bulk acoustic resonators (FBARs) and solidly mounted resonators (SMRs), or surface acoustic wave (SAW) resonators. The resonators convert electrical signals to mechanical signals or vibrations, and/or mechanical signals or vibrations to electrical signals. A BAW resonator, for example, is an acoustic device comprising a stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers).

Desirably, the BAW resonator excites only thickness-extensional (TE) modes, which are longitudinal mechanical waves having propagation (k) vectors in the direction of propagation. The TE modes desirably travel in the direction of the thickness (e.g., z-direction) of the piezoelectric layer.

In general, the most important vibrational mode for radio frequency (RF) filter applications is the TE mode, which is in parallel with an electrical field or perpendicular to the BAW resonator surface. The longitudinal mode is activated by varying electrical voltage across the BAW resonator, and therefore the electrical field across polarized charges (i.e., dipoles, consisting of positive and negative charged ions in AlN film), resulting in contraction and expanding dependent on the direction of the electrical field. At a certain frequency, vibration of the dipoles is in phase with the electrical field, where series resonance occurs and its correspondent frequency is called series resonant frequency (Fs). Where the vibration is totally out of phase with the electrical field (i.e., 180° phase difference between the phases of the vibration and the electric field), the resonator reaches to parallel resonance, and its corresponding frequency is called parallel resonant frequency, (Fp).

In known BAW resonators, loss of acoustic energy at the interfaces of the BAW resonator ultimately degrades the electrical performance of the BAW resonator and devices that comprise such BAW resonators.

What is needed, therefore, is a BAW resonator that overcomes at least the shortcomings of known BAW resonators described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
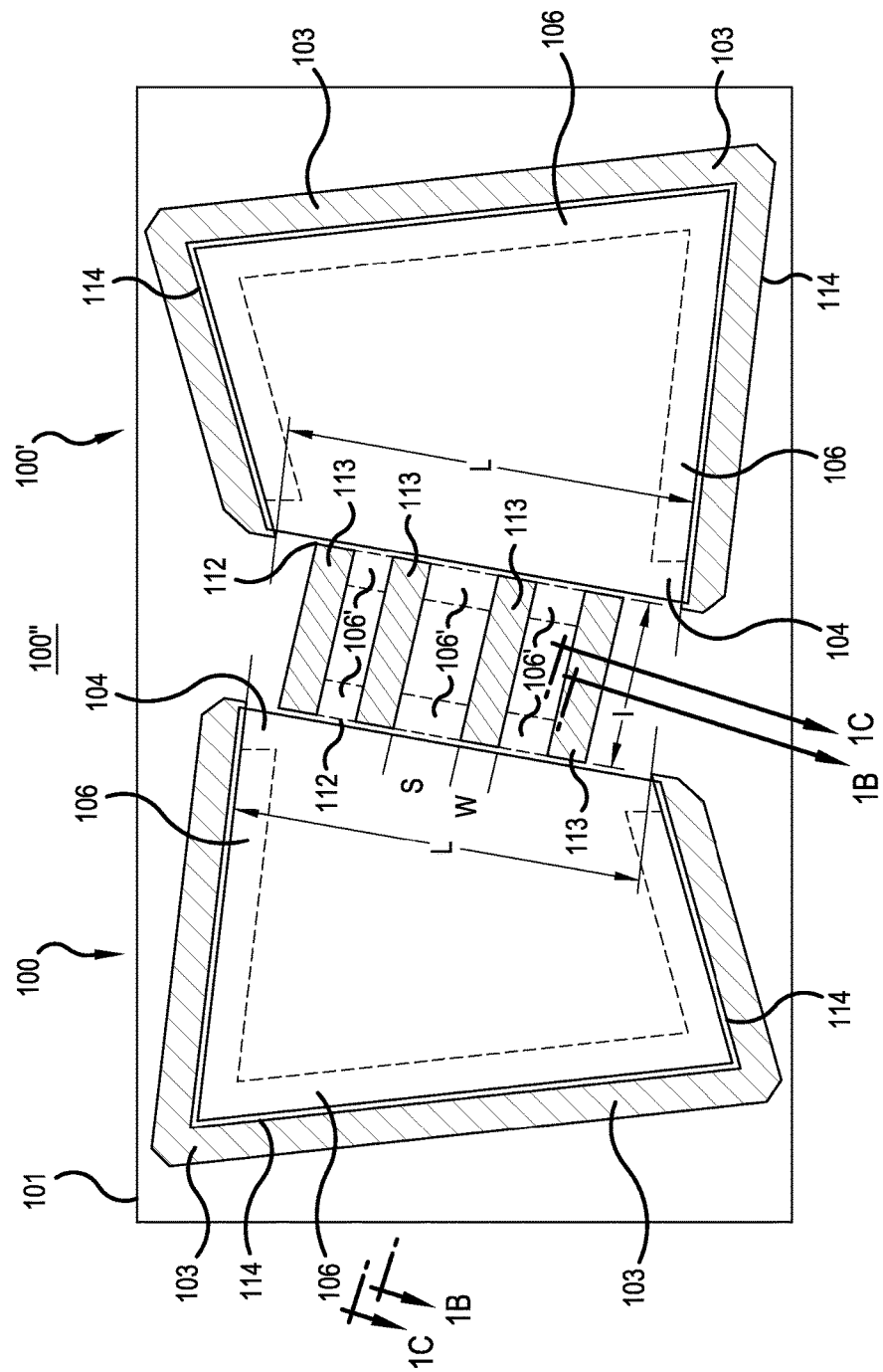
FIG. 1A is a top view of a BAW resonator structure in accordance with a representative embodiment.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In general, confinement of acoustic energy at the connections side(s) of a BAW resonator is different from confinement of acoustic energy at the non-connecting side(s) of the BAW resonator. If the confinement at the connection sides is better than at the non-connection sides, energy confinement at the non-connection sides could be improved by providing additional connection structures (thus reducing the length of the non-connection side), which need not be connected electrically. The scope of the present teachings addresses the opposite case: namely, the present teachings presume that acoustic losses at the connection side(s) are larger than acoustic losses at the non-connection side(s) of the BAW resonators of the representative embodiments. According to representative embodiments described below, BAW resonator structures are provided with multiple connections at a connection side of the BAW resonator, providing, for example, improvements in acoustic performance compared to BAW resonators with a single connection that extends along the entire length of the connection side. The acoustic resonator structures useful in the apparatuses of the present teachings comprise BAW resonators, including FBARs or SMRs, although the present teachings contemplate the use of surface acoustic wave (SAW) resonators. When connected in a selected topology, a plurality of the resonators can act as an electrical filter. For example, the acoustic resonators may be arranged in a ladder-filter or lattice-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers (diplexers, triplexers, quadplexers, quintplexers, etc.).

A variety of devices, structures thereof, materials and methods of fabrication are contemplated for the BAW resonators of the apparatuses of the present teachings. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684 to Ruby et al.; U.S. Pat. Nos. 7,791,434 8,188,810, and 8,230,562 to Fazzio, et al.; U.S. Pat. No. 7,280,007 to Feng et al.; U.S. Pat. Nos. 8,248,185 and 8,902,023 to Choy, et al.; U.S. Pat. No. 7,345,410 to Grannen, et al.; U.S. Pat. No. 6,828,713 to Bradley, et al.; U.S. Pat. No. 7,561,009 to Larson, et al.; U.S. Patent Application Publication No. 20120326807 to Choy, et al.; U.S. Patent Application Publications Nos. 20110180391 and 20120177816 to Larson III, et al.; U.S. Patent Application Publication No. 20070205850 to Jamneala et al.; U.S. Patent Application Publication No. 20110266925 to Ruby, et al.: U.S. Patent Application Publication No. 20130015747 to Ruby, et al.; U.S. Patent Application Publication No. 20130049545 to Zou, et al.; U.S. Patent Application Publication No. 20140225682 to Burak, et al.; U.S. Patent Publication No. 20140132117 to John L. Larson III; U.S. Patent Publication Nos.: 20140118090 and 20140354109; and U.S. patent application Ser. No. 14/191,771, entitled "Bulk Acoustic Wave Resonator having Doped Piezoelectric Layer" to Feng, et al. and filed on Feb. 27, 2014. The entire disclosure of each of the patents, patent application publications, and the patent application, listed above are hereby specifically incorporated by reference herein. It is emphasized that the components, materials and method of fabrication described in these patents and patent applications are representative and other methods of fabrication and materials within the purview of one of ordinary skill in the art are also contemplated.

Referring to FIG. 1A, a top view of a BAW resonator structure 100" is shown. As will be appreciated by one of ordinary skill in the art, the BAW resonator structure 100" may be a component of a device (e.g., a filter) used in an electrical device (e.g., a transceiver). The BAW resonator structure comprises a first BAW resonator 100 electrically connected to a second BAW resonator 100'. It is emphasized that the first and second BAW resonators 100, 100' are merely illustrative examples of BAW resonators that are contemplated by the present teachings to be connected according to the representative embodiments described herein; and accordingly are not intended to limit the scope of the present teachings. Alternatively, a variety of known BAW resonator structures are contemplated for use in connection with the present teachings. Some of these alternate BAW resonator structures are described in the above-referenced patents, patent application publications, and patent applications. Other BAW resonator structures such as, coupled resonator filters (CRFs), double bulk acoustic resonator (DBR), stacked bulk acoustic resonator (SBAR), and others within the purview of one of ordinary skill in the art are contemplated for use in connection with the representative embodiments described herein.

The first and second BAW resonators 100,100' are disposed over a common substrate 101, and each comprise a lower electrode 102 (not shown in FIG. 1A) disposed beneath a piezoelectric layer 103 and an upper electrode 104. As will become clearer as the present description continues, the substrate 101 comprises a material that is not only amendable to known microfabrication and semiconductor processing methods. Generally, the substrate 101 comprises silicon (i.e., polycrystalline or monocrystalline), but other materials, such as gallium arsenide (GaAs) and indium phosphide (InP), are contemplated.

The first and second BAW resonators 100, 100' each illustratively comprise a cantilevered portion 106 of the upper electrode 104 provided on at least one side of the upper electrode 104. The non-connection sides of first and second BAW resonators 100, 100' may also comprise other structures useful in improving the performance of the second BAW resonator 100' (e.g., a raised or a recessed frame element, or both, disposed adjacent to the perimeter of the active area 110), and are contemplated for use in addition to, or instead of, the cantilevered portion 106.

Each upper electrode 104 comprises an interconnection side 112 and non-connecting sides 114. In a representative embodiment, cantilevered portions 106 are provided along each non-contacting side 114 and have the same width. A plurality of electrical connections 113 is provided between the respective interconnection sides 112 of the first and second BAW resonator 100, 100'. The plurality of electrical connections 113 each typically comprise the same material and have the same thickness as the upper electrode 104. Moreover, and as depicted in FIG. 1A, cantilevered portions 106' are disposed along interconnection side 112, with one cantilevered portion 106' disposed between adjacent electrical connections 113 112, and otherwise along the length of the interconnection side where electrical connections 113 are not disposed. These cantilevered portions 106', which have a width substantially equal to the spacing (s), are formed by the same method and by the same sequence used to fabricate cantilevered portions 106 along the non-connecting sides. Cantilevered portions 106' are used in improvement of the acoustic performance of first and second BAW resonators 100, 100' in the same manner as cantilevered portions 106.

Notably, the plurality of electrical connections 113 are disposed along a length L of each of the interconnection sides. As described more fully below, improvements in electrical performance of the first and second BAW resonators 100, 100' are realized by the present teachings by replacing an electrical connection that extends along the entire length (L) with the plurality of electrical connections 113 that have a width (w), which is substantially less than the length (L). The plurality of electrical connections 113 are spaced from each other by a spacing (s). The spacing (s) between each of the plurality of electrical connections 113 can be greater than, less than, or substantially equal to the width (w). Furthermore, each of the plurality of electrical connections 113 has a length (l), which is beneficially comparatively small in order to reduce parasitic effects (e.g., inductance, resistance). Generally, the length (l) of the electrical connections is selected to minimize parasitic effects and to maintain the first and second BAW resonators 100, 100' comparatively close to each other to reduce the footprint of the device that includes the first and second BAW resonators 100, 100'.

The sum of the widths (w) of the plurality of electrical connections 113 is often described as a percentage of the sum of the lengths of the sides of the upper electrode 104, or a percentage of its perimeter. While the width (w) of each of the plurality of electrical connections 113 may be the same, this is not necessarily the case. Moreover, although the spacing (s) between each electrical connection 113 may be the same, this is also not essential. Finally, and as described more fully below, the number of electrical connections 113 is not limited to the four electrical connections 113 shown.

As is known, the fundamental mode of the first and second BAW resonators 100, 100' is the longitudinal extension mode or "piston" mode. This mode is excited by the application of a time-varying voltage to the two electrodes at the resonant frequency of the first and second BAW resonators 100, 100'. The piezoelectric material converts energy in the form of electrical energy into mechanical energy. In an ideal FBAR having infinitesimally thin electrodes, resonance occurs when the applied frequency is equal to the velocity of sound of the piezoelectric medium divided by twice the thickness of the piezoelectric medium: $f=v_{ac}/(2*T)$, where T is the thickness of the piezoelectric medium and $v_{ac}$ is the acoustic phase velocity. For resonators with finite thickness electrodes, this equation is modified by the weighted acoustic velocities and thicknesses of the electrodes.

A quantitative and qualitative understanding of the Q of a resonator may be obtained by plotting on a Smith Chart the ratio of the reflected energy to applied energy as the frequency is varied for the case in which one electrode is connected to ground and another to signal, for an FBAR resonator with an impedance equal to the system impedance at the resonant frequency. As the frequency of the applied energy is increased, the magnitude/phase of the FBAR resonator sweeps out a circle on the Smith Chart. This is referred to as the Q-circle. Where the Q-circle first crosses the real axes (horizontal axes), this corresponds to the series resonance frequency $f_s$. The real impedance (as measured in Ohms) is $R_s$. As the Q-circle continues around the perimeter of the Smith chart, it again crosses the real axes. The second point at which the Q circle crosses the real axis is labeled $f_p$, the parallel or anti-resonant frequency of the FBAR. The real impedance at $f_p$ is $R_p$.

Often it is desirable to minimize $R_s$ while maximizing $R_p$. To this end, a BAW resonator can be modeled using a modified Butterworth-Van Dyke model (MBVD) model. The frequency response of this model is a pass-band response, with frequency response for frequencies below the pass-band being attenuated by capacitances Cm and Co, and with frequency response for frequencies above the pass-band being attenuated by an inductance Lm. At series resonance $f_s$, the BAW resonator can be modeled by a series-resonant combination of an inductance Lm and capacitance Cm in series with a parasitic resistance Rs. At parallel resonance, the BAW resonator can be modeled by a parallel-resonant combination of inductance Lm and capacitance Co in parallel with a parasitic resistance Rp. Resistances Rs and Rp represent various heat losses and acoustic losses within the acoustic resonator.

At series resonance $f_s$ the BAW resonator behaves like a short-circuit, so any small voltage applied to the resonator results in large current (because dipoles are resonating in phase with electric field). The only limiting factor to that current is loss in the circuit, phenomenologically described by Rs. The Joule heating dissipated in this model is Rs*current^2, so the smaller the Rs the smaller the loss and the higher the Qs. Plainly, therefore, it is beneficial to provide as low a value for Rs as possible.

At parallel resonance, both branches of the MBVD model are at resonance (thus parallel resonance). Physically, the capacitive current offsets the piezoelectric current so it appears that for any applied voltage to the circuit there is no current flowing to the outside: thus the circuit appears to be open. However, since there are always losses present there is always a Joule heating loss given by $V^2/Rp$. Thus the larger the Rp (more ideal cancelation of piezoelectric and capacitive currents), the larger the Qp. On the circuit level, at parallel resonance Qp is given by: Qp=Rp*sqrt(C/L).

A sink, or source of loss, of lateral modes, and likely some energy from longitudinal modes in known BAW resonators occurs at an electrical connection to the BAW resonator at the interconnection side 112. These losses are directly proportional to the length of the electrical connection at the interconnection side 112. In known BAW resonators, the electrical connection at the interconnection side extends along the entire length of the interconnection side. Specifically, the interconnection side of BAW resonator necessarily provides an electrical connection to an external component (e.g., an adjacent BAW resonator). The acoustic energy sink provided by the acoustic connection results from incomplete acoustic isolation at the interconnection side. When, as in known BAW resonators, the entire length of the interconnection side is used to effect the electrical connection to an adjacent BAW resonator or other electrical connection (e.g., signal line), the maximum amount of acoustic energy can be lost. This reduces Qp, which is a measure of the acoustic energy confinement in a BAW resonator, and Rp, a measure of the electrical performance of the BAW resonator.

The present teachings beneficially mitigate the acoustic losses by reducing the percentage or portion of the interconnection side 112 of the first and second BAW resonators 100, 110' that is used to effect the electrical connection between the first and second BAW resonators 100, 110'. As described more fully below, the reduction in acoustic losses realized by the present teachings results in an increase in $R_p$ (and $Q_p$), and thus acoustic energy confinement, with an acceptable increase in $R_s$.

Notably, in a BAW resonator such as either of first or second BAW resonators 100, 100', one-fourth of the total length of the sides (e.g., interconnection side and non-contacting sides 114) of upper electrode 104 would be electrically connected to an external component if the entire interconnection side were used to effect the electrical connection to an adjacent BAW resonator or other electrical connection. By contrast, the present teachings substantially reduce the portion or percentage of the total length of the sides of upper electrode 104 that are used to make an electrical connection to an external component, such as an adjacent BAW resonator or other electrical connection. Such a reduction results in a significant increase in $R_p$.

By way of example, if the total width of the electrical connection at the interconnection side 112 were a certain percentage of the total perimeter of the upper electrode 104, a certain value of $R_p$ would be realized. If the width of the electrical connection were cut in half (i.e., half the certain percentage of the total perimeter of the upper electrode 104) and remained a single connection, $R_p$ increases significantly. However, by providing a plurality of electrical connections 113 that in total width were equal to the selected "half" width (i.e., the widths of electrical connections 113 in sum were equal to the "half" percentage of this example), beneficial improvement of Rs at constant Rp is realized by inclusion of the plurality of electrical connections 113 of the representative embodiments.

As can be appreciated, reducing the total width (sum of nw, where n is the number of electrical connections 113) of the electrical connections 113 at the interconnection side 112 of first and second BAW resonators 100, 100', while beneficially providing improvement in $R_p$ (and $Q_p$) by reducing acoustic energy loss, results in an undesired increase in the parasitic resistance at $F_s$, $R_s$, which, as noted above, is beneficially maintained at a comparatively low value. It can be shown for comparatively short electrical connections 113 (e.g., having a length 1) that the additional parasitic resistance ($R_s$) drops by a factor of (number (n) of connections)$^{-1}$. So, continuing the noted illustrative example, reducing the width of the electrical connection to the certain percentage of the total perimeter of the upper electrode 104 in one connection could result in an increase in $R_s$ by a certain factor of XΩ. However, by providing four electrical connections 113, the total width of which (4w) is equal to the certain percentage of the total perimeter of the upper electrode 104, the additional parasitic resistance $R_s$ is beneficially reduced to approximately (0.25)XΩ.

While further reductions in the parasitic resistance $R_s$ could be realized by further increasing the number of the plurality of electrical connections 113, the number is limited by a reduction in the $R_p$ (and $Q_p$) that can occur due to limits in photolithography. Specifically, it is believed that suitable improvements in $R_p$ (and $Q_p$) at an acceptable increase in $R_s$ are realized by providing between approximately three (3) and approximately six (6) electrical connections 113. At more than six electrical connections 113, it is believed that the acoustic physics at the interface of the upper electrode 104 and the plurality of electrical connections 113 is adversely impacted due to the shapes and dimensions of the electrical connections 113. This adverse impact on the physics is manifest in reductions in $R_p$ (and $Q_p$) that cannot be justified by the marginal decrease in $R_s$.

As can be appreciated, there is therefore, a tradeoff between the gains in $R_p$ (and $Q_p$) with the reduction in $R_s$ that plays a part in the determination of the number (n) of electrical connections 113 and the total width (nw) of the plurality of electrical connections 113 as a percentage of the total perimeter of the upper electrode 104. Generally, the number of electrical connections 113 is between two and five, and the total width (nw) of the plurality of electrical connections 113 as a percentage of the total perimeter of the upper electrode 104 is in the range of approximately 5% and approximately 25%.

While design considerations and processing impact the selection of the width (w) of the electrical connections 113 and spacing (s) therebetween (the thickness is generally the same that of the upper electrode 104), the plurality of electrical connections 113 have a width (w) in the range of approximately 5 µm to approximately 50 µm, although other widths are contemplated. The spacing (s) is typically the same as the selected width (w), but, as noted above can be greater or smaller than the width (w).

Figure 1B:
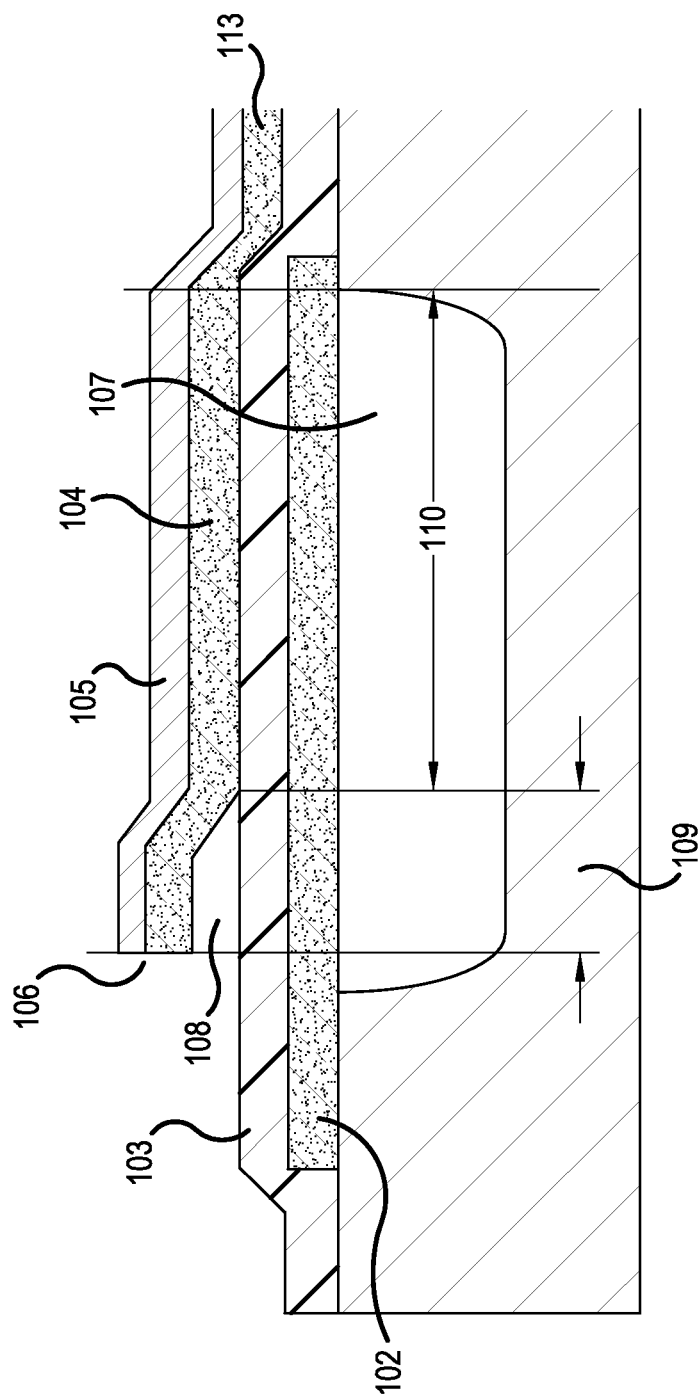
FIG. 1B is a cross-sectional view of the BAW resonator structure depicted in FIG. 1A.

FIG. 1B depicts a cross-sectional view of first BAW resonator 100 along the line 1B-1B and contemplated for use in the various apparatuses of the present teachings. The details of second BAW resonator 100' are essentially identical to those of first BAW resonator 100 and are not repeated in order to avoid obscuring the details of the presently described embodiments.

As can be appreciated, the first BAW resonator 100 comprises an FBAR. It is emphasized that the first BAW resonator 100 is merely illustrative, and SMRs are contemplated for use in the various apparatuses of the present teachings by replacing cavity 107 with, for example, an acoustic Bragg reflector. Generally, the cavity 107 or Bragg reflector may be referred to as a reflective element.

The first BAW resonator 100 comprises the substrate 101, and the lower electrode 102 disposed beneath the piezoelectric layer 103, which comprises a first surface in contact with the lower electrode 102 and a second surface in contact with the upper electrode 104. An optional passivation layer 105 is provided over the upper electrode 104. More generally, the piezoelectric layer 103 has a first surface disposed over the lower electrode 102 and a second surface disposed beneath the upper electrode. Notably, and as will be apparent to one of ordinary skill in the art, other layers may be provided in the acoustic stack, which are not shown in FIG. 1B. For example, adhesion layers, and/or etch stop layers provided for processing reasons, and/or temperature compensation structures (i.e., interposer layers disposed over temperature compensation layers) f may be provided and, as such the piezoelectric layer 103 is not in direct contact with one or both of the lower and upper electrodes 102, 104. Many of these layers and structures are described in the above referenced patents, patent application publications, and patents applications, or are otherwise known, and are not detailed presently to avoid obscuring the presently described representative embodiments.

The cantilevered portion 106 of the upper electrode 104 is provided on at least one side of the upper electrode 104; and, as noted above, cantilevered portions 106' (not shown in FIG. 1B) are provided between each of the electrical connections 113. It is emphasized that the use of the cantilevered portions 106, 106' is merely illustrative, and other structures useful in improving the performance of the first BAW resonator 100 (e.g., a frame element disposed adjacent to the perimeter of an active area 110) are contemplated for use in addition to, or instead of the cantilevered portions 106, 106'.

The lower and upper electrodes 102, 104 each comprise one or two (bi-electrode) electrically conductive materials (e.g., molybdenum (Mo), W, Pt, Ru, Al, Ta, Cu, or Ru) and provide an oscillating electric field in the z-direction of the coordinate system shown (i.e., the direction of the thickness of the substrate 101). In the illustrative embodiment described presently, the z-axis is the axis for the TE (thickness-extensional or "longitudinal") mode(s) for the resonator. In a representative embodiment, the piezoelectric layer 103 and lower and upper electrodes 102, 104 are suspended over a cavity 107 that substantially provides acoustic isolation with the substrate 101. Accordingly, the first BAW resonator 100 is a mechanical resonator, which can be electrically coupled via the piezoelectric layer 103. Other configurations that foster mechanical resonance by FBARs, CRFs, DBARs, SBARs, and similar devices are contemplated. For example, as described in connection with FIG. 1B, rather than cavity 107, the first BAW resonator 100 can be located over an acoustic Bragg reflector, such as a mismatched acoustic Bragg reflector (not shown in FIG. 1A) formed in or on the substrate 101 to provide acoustic isolation.

The piezoelectric layer 103 comprises a highly textured piezoelectric layer (e.g., AlN), and thus has a well-defined C-axis. As described more fully below, in an apparatus comprising a plurality of first BAW resonators 100, the polarization of each BAW resonator impacts the type of the connection (e.g., series connection, anti-series connection) that is made between the first and second BAW resonators 100, 100'. As will be appreciated by one of ordinary skill in the art, the growth of piezoelectric material along a C-axis of the material dictates the polarization of the BAW resonator, and thus the type of connection to be implemented. As such, providing a highly-textured piezoelectric layer 103, such as by methods described in the above-references U.S. Patent Application Publications Nos. 20110180391 and 20120177816 to Larson III, et al., is useful in apparatuses comprising First BAW resonator 100.

In addition to being highly-textured, the piezoelectric layer 103 of representative embodiments may also comprise one or more rare-earth (e.g., scandium (Sc)) doped layers of piezoelectric material (e.g., aluminum nitride (AlN)) as described in certain patent applications incorporated by reference above (e.g., U.S. Patent Application Publication 20140132117; and U.S. patent application Ser. No. 14/191,771 to Feng, et al.).

The cantilevered portion 106 of the upper electrode 104 extends over a gap 108, which illustratively comprises air. In a representative embodiment, a sacrificial layer (not shown) is deposited by known technique over the lower electrode 102 and a portion of the piezoelectric layer 103. The cantilevered portion 106 extends beyond an edge of the active area 110 by a width 109 as shown.

The upper electrode 104 is connected to second BAW resonator 100' or another electrical component (e.g., a signal line (not shown)) selected for the particular application of the first BAW resonator 100 via the plurality of electrical connections 113. This portion of the first BAW resonator 100 comprises the interconnection side 112 of the first BAW resonator 100. The interconnection side 112 of the upper electrode 104 to which the electrical contact is made does not comprise a cantilevered portion. By contrast, one or more non-connecting sides of the first BAW resonator 100 may comprise cantilevered portions 106 that extend beyond the edge of the active area 110.

As noted above, the plurality of electrical connections 113 generally are made of the same material and have the same thickness as the upper electrode 104. The plurality of electrical connections 113 may be fabricated during the defining step of the upper electrode 104 using known methods.

Figure 1C:
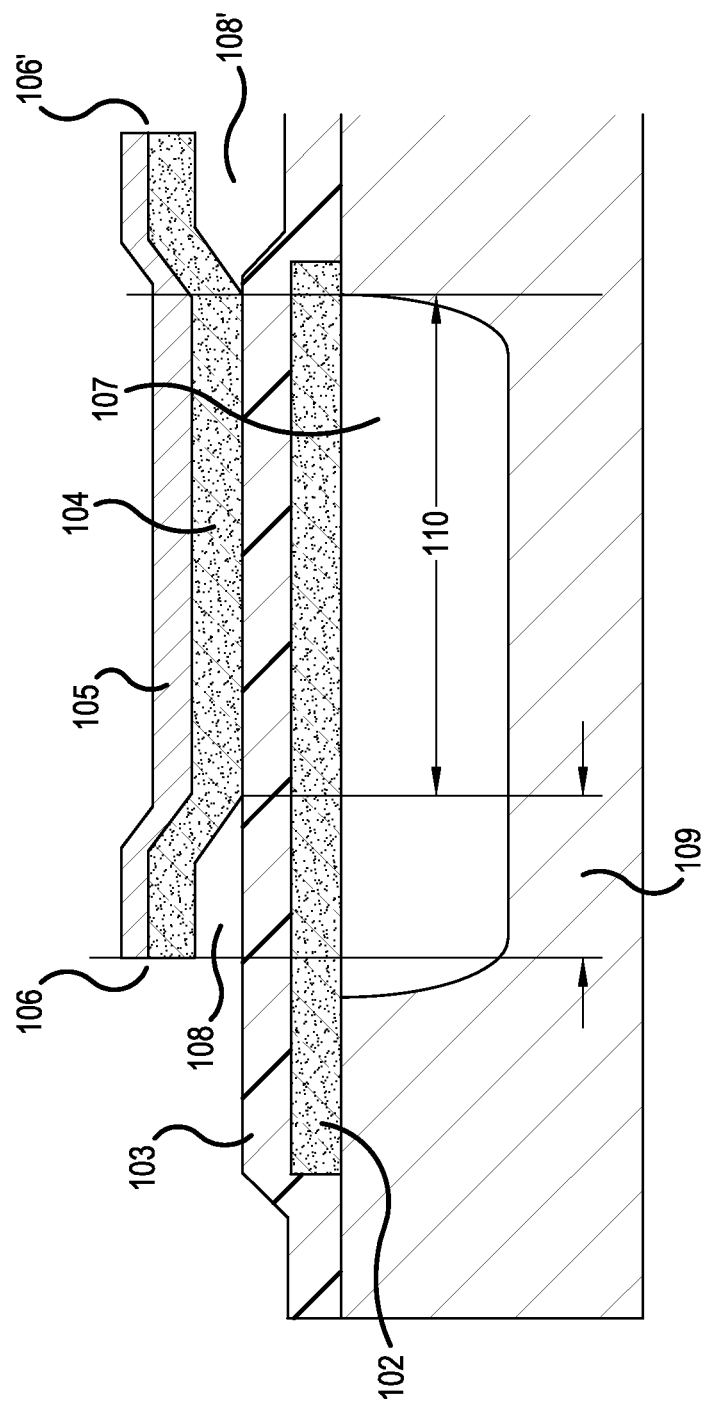
FIG. 1C is a cross-sectional view of the BAW resonator structure depicted in FIG. 1A.

FIG. 1C depicts a cross-sectional view of first BAW resonator 100 along the line 1C-1C contemplated for use in the various apparatuses of the present teachings. The details of second BAW resonator 100' are essentially identical to those of first BAW resonator 100 and are not repeated in order to avoid obscuring the details of the presently described embodiments.

Cantilevered portions 106' of the upper electrode 104 are provided between each of the electrical connections 113 on the connection side 112 of BAW resonator 100. The cantilevered portions 106' have a width equal to the spacing (s) between the electrical connections 113. The cantilevered portions 106' are formed using substantively the same method used to form cantilevered portion 106. Like gap 108, a gap 108' is provided beneath each cantilevered portion 106', and may comprise air, or other material such as a dielectric material described, for example in U.S. Pat. No. 8,902,023, to Choy, et al. Cantilevered portions 106' are formed using known methods, such as described in U.S. Pat. No. 8,902,023. It is emphasized that the use of the cantilevered portions 106, 106' is merely illustrative, and other structures useful in improving the performance of the first BAW resonator 100 (e.g., a frame element disposed adjacent to the perimeter of an active area 110) are contemplated for use in addition to, or instead of the cantilevered portions 106'.

Figure 2A:
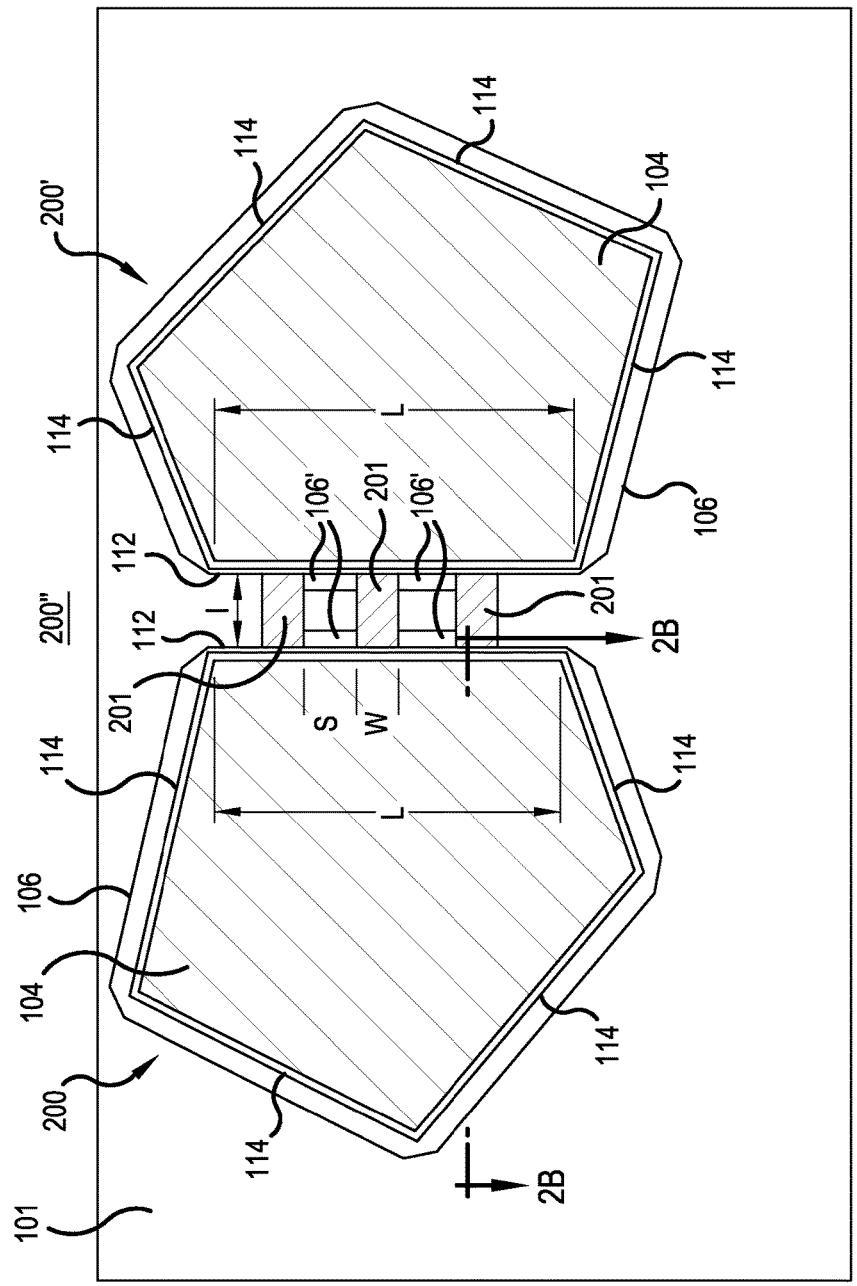
FIG. 2A is a top view of a BAW resonator structure in accordance with a representative embodiment.

Referring to FIG. 2A, a top view of a BAW resonator structure 200" in accordance with a representative embodiment is shown. As will be appreciated by one of ordinary skill in the art, the BAW resonator structure 200" may be a component of a device (e.g., a filter) used in an electrical device (e.g., a transceiver). The BAW resonator structure comprises a first BAW resonator 200 electrically connected to a second BAW resonator 200'. Many aspects, details, materials and methods of fabrication of the BAW resonator structure 200" are substantively identical to those of BAW resonator structure 100" described above, and are often not repeated in order to avoid obscuring the description of the presently described representative embodiments.

The first and second BAW resonators 200, 200' are disposed over the common substrate 101, and each comprise lower electrode 102 (not shown in FIG. 2A) disposed beneath a piezoelectric layer 103 (not shown in FIG. 2A) and an upper electrode 104.

The first and second BAW resonators 200, 200' each illustratively comprise the cantilevered portion 106 of the upper electrode 104 provided on at least one side of the upper electrode 104. Again, it is emphasized that the use of the cantilevered portion 106 is merely illustrative, and other structures useful in improving the performance of the first and second BAW resonators 200, 200' (e.g., a frame element disposed adjacent to the perimeter of the active area 110) are contemplated for use in addition to, or instead of, the cantilevered portion 106.

Each upper electrode 104 comprises an interconnection side 112 and non-connecting sides 114. In a representative embodiment, cantilevered portions 106 are provided along each non-contacting side 114 and have the same width. A plurality of bridges 201 is provided between the respective interconnection sides 112 of the first and second BAW resonator 100, 100'. The plurality of bridges 201 are electrically connecting, and each typically comprise the same material and have the same thickness as the upper electrode 104. Further details of the plurality of bridges 201 can be found, for example, in above-referenced and commonly owned U.S. Pat. Nos. 8,248,185 and 8,902,023, the disclosures of which are specifically incorporated herein by reference. Moreover, and as depicted in FIGS. 2A and 2C, cantilevered portions 106' are disposed along the interconnection side 112, with one cantilevered portion 106' disposed between adjacent bridge 201. These cantilevered portions 106', which have a width substantially equal to the spacing (s), are formed by the same method and by the same sequence used to fabricate cantilevered portions 106 along the non-connecting sides. Cantilevered portions 106' are used in improvement of the electrical performance of first and second BAW resonators 100, 100' in the same manner as cantilevered portions 106.

Notably, the plurality of bridges 201 is disposed along a length L of the each of the interconnection sides 112. Like the plurality of electrical connections 113, the improvements in electrical performance of the first and second BAW resonators 200, 200' is realized by the present teachings by replacing an electrical connection that extends along the entire length (L) with the plurality of bridges 201 that each have a width (w). The plurality of bridges 201 are spaced from each other by a spacing (s); and have a length (l). The spacing (s) between each of the plurality of bridges 201 can be greater than, less than, or substantially equal to the width (w). Furthermore, each of the plurality of bridges 201 has a length (l), which is beneficially comparatively small in order to reduce parasitic effects (e.g., inductance, resistance). Generally, the length (l) of the electrical connections is selected to minimize parasitic affects and to maintain the first and second BAW resonators 100, 100' comparatively close to each other to reduce the footprint of the device that includes the first and second BAW resonators 100, 100'.

The sum of the widths (w) of the plurality of bridges 201 is often described as a percentage of the sum of the lengths of the sides of the upper electrode 104, or a percentage as its perimeter. While the width (w) of each of the plurality of bridges 201 may be the same, this is not necessarily the case. Moreover, though the spacing (s) between each bridge 201 may be the same, this is also not essential. Finally, and as described more fully below, the number of bridges 201 is not limited to the three bridges 201 shown.

Like the plurality of electrical connections 113, reducing the total width (sum of nw, where n is the number of bridges 201) of the bridges 201 at the interconnection side 112 of first and second BAW resonators 200, 200', while beneficially providing improvement in $R_p$ (and $Q_p$) by reducing acoustic energy loss, results in an undesired increase in the parasitic resistance at $F_s$, $R_s$, which, as noted above, is beneficially maintained at a comparatively low value. It can be shown for comparatively short bridges 201, such as those of the representative embodiments, that the additional parasitic resistance ($R_s$) drops by a factor of (number of connections)$^{-1}$. By way of example, reducing the width of the electrical connection to a predetermined percentage of the total perimeter of the upper electrode 104 in one connection could result in an increase in $R_s$ by a certain factor of $X\Omega$. However, by providing three bridges 201, the total width of which (3w) is equal to the predetermined percentage of the total perimeter of the upper electrode 104, the additional parasitic resistance $R_s$ is beneficially reduced to approximately 0.3$X\Omega$.

While further reductions in the parasitic resistance $R_s$ could be realized by further increasing the number of the plurality of bridges 201, the number is limited by a reduction in the $R_p$ (and $Q_p$) that can occur due to limits in photolithography. Specifically, it is believed that suitable improvements in $R_p$ (and $Q_p$) at an acceptable increase in $R_s$ are realized by providing between approximately two (2) and approximately six (6) bridges 201. At more than six bridges 201, it is believed that the acoustic physics at the interface of the upper electrode 104 and the plurality of bridges 201 is adversely impacted due to the shapes and dimensions of the bridges 201. This adverse impact on the physics is manifest in reductions in $R_p$ (and $Q_p$) that cannot be justified by the marginal decrease in $R_s$.

As can be appreciated, there is therefore, a tradeoff between the gains in $R_p$ (and $Q_p$) with the reduction in $R_s$ that plays a part in the determination of the number (n) of bridges 201 and the total width (nw) of the plurality of bridges 201 as a percentage of the total perimeter of the upper electrode 104. Generally, the number of bridges 201 is between three and five, and the total width (nw) of the plurality of bridges 201 as a percentage of the total perimeter of the upper electrode 104 is in the range of approximately 5% and approximately 25%.

Figure 2B:
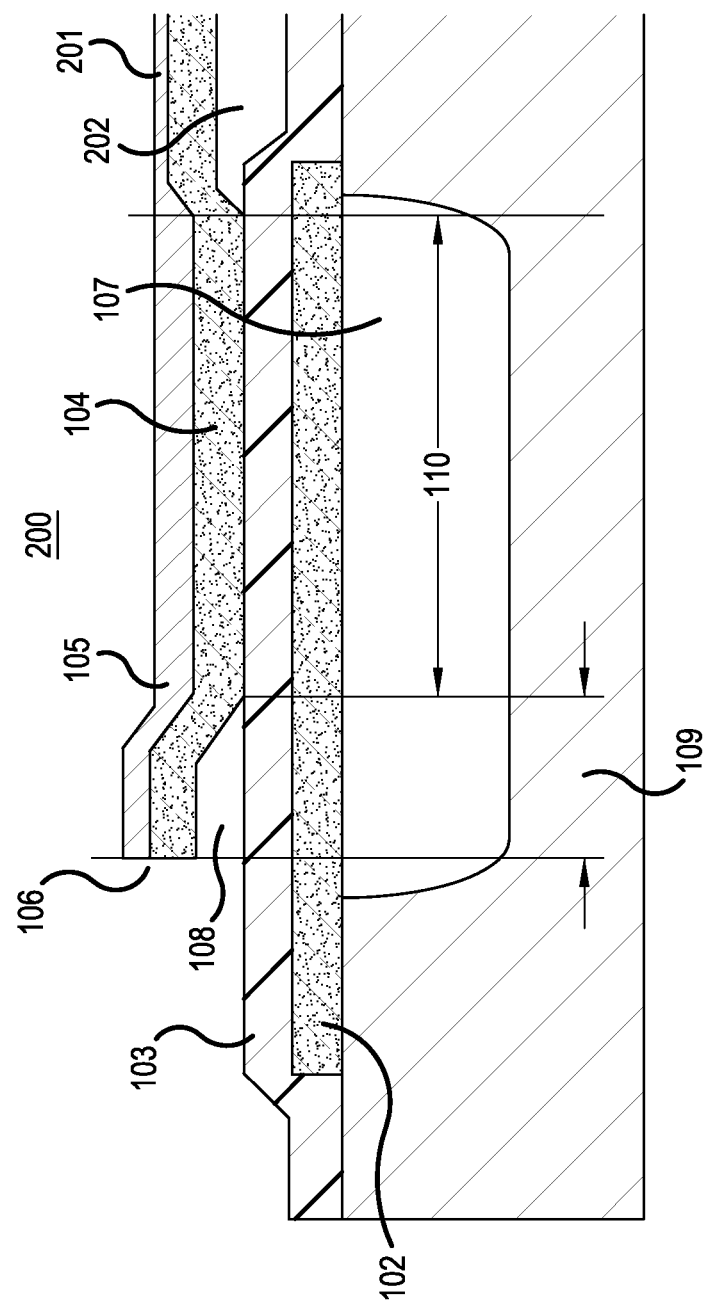
FIG. 2B is a cross-sectional view of the BAW resonator structure depicted in FIG. 2A.

FIG. 2B shows a cross-sectional view of first BAW resonator 200 taken along line 2B-2B of FIG. 2A and in accordance with a representative embodiment. Many of the features of first BAW resonator 200 are common to those of first BAW resonator 100 described in connection with representative embodiments in FIGS. 1A-1B. The details of common features, characteristics and benefits thereof are not repeated in order to avoid obscuring the presently described embodiments. Furthermore, the details of second BAW resonator 200' are essentially identical to those of first BAW resonator 200 and are not repeated in order to avoid obscuring the details of the presently described embodiments.

The first BAW resonator 200 comprises bridge 201 along the interconnection side 112. The bridge 201 provides a gap 202, which may be a void (e.g., air) or may be filled with a low acoustic impedance material. The bridge 201 is described in commonly owned U.S. Pat. Nos. 8,248,185 and 8,902,023, and as such many of the details of the bridge 201 are not repeated in the present application to avoid obscuring the description of the representative embodiments of the BAW resonator 300.

As can be appreciated, the first BAW resonator 200 comprises an FBAR. It is emphasized that the first BAW resonator 200 is merely illustrative, and SMRs are contemplated for use in the various apparatuses of the present teachings by replacing cavity 107 with, for example, an acoustic Bragg reflector.

As described above, the cantilevered portion 106 provides an improvement in the Q-factor. Similarly, the bridge 201 also provides an improvement in the Q-factor. Beneficially, the combination of the cantilevered portion 106 and the bridge 201 provides a further improvement in the Q-factor of the BAW resonator 200. To this end, inclusion of the bridge 201 with the cantilevered portion 106 in the BAW resonator 200 results in an improvement in the Q-factor at parallel resonance (Qp) and some impact on the Q-factor at series resonance (Qs). This is somewhat expected since the bridge 201 predominantly impacts Qp, as described in U.S. Pat. Nos. 8,248,185 and 8,902,023, referenced above.

In the representative embodiments described above, electrical connections (e.g., by the plurality of electrical connections 113 or by the plurality of bridges 201), were made between upper electrodes 104 or the first and second BAW resonators 100, 100' and 200, 200', respectively. This is merely illustrative, and connections between other electrode pairs are contemplated.

Figure 3A:
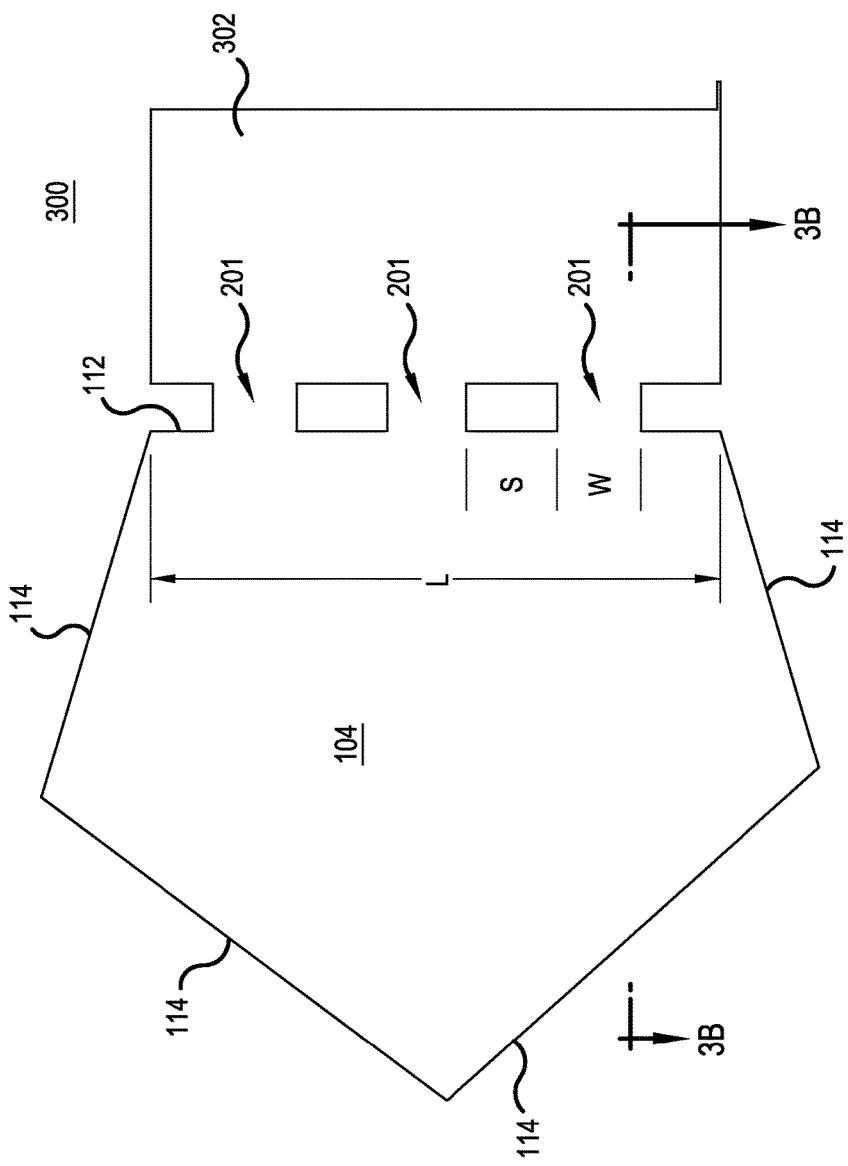
FIG. 3A is a top view of a BAW resonator structure in accordance with a representative embodiment.

Referring to FIG. 3A, a top view of a BAW resonator 300 in accordance with a representative embodiment is shown.

Many aspects, details, materials and methods of fabrication of the BAW resonator 300 are substantively identical to those of first and second BAW resonators 100, 100' and 200, 200' described above, and are often not repeated in order to avoid obscuring the description of the presently described representative embodiments. The BAW resonator 300 may be connected to another BAW resonator (not shown in FIG. 3A) or to another electrical component.

The BAW resonator 300 is disposed over the common substrate 101, and each comprise lower electrode 102 (not shown in FIG. 2A) disposed beneath piezoelectric layer 103 and upper electrode 104.

The BAW resonator 300 illustratively may include the cantilevered portion 106 (not shown in FIGS. 3A, 3B) of the upper electrode 104 provided on at least one side of the upper electrode 104. Again, it is emphasized that the use of the cantilevered portion 106 is merely illustrative, and other structures useful in improving the performance of the BAW resonator 300 (e.g., a frame element disposed adjacent to the perimeter of the active area 110) are contemplated for use in addition to, or instead of, the cantilevered portion 106.

Upper electrode 104 comprises interconnection side 112 and non-connecting sides 114. In a representative embodiment, cantilevered portions 106 are provided along each non-contacting side 114 and have the same width. A plurality of bridges 201 is provided between the respective interconnection sides 112 of the BAW resonator 300. The plurality of bridges 201 are electrically connecting, and each typically comprise the same material and have the same thickness as the upper electrode 104. Further details of the plurality of bridges 201 can be found, for example, in above-referenced and commonly owned U.S. Pat. Nos. 8,248,185 and 8,902,023, the disclosures of which are specifically incorporated herein by reference. Alternatively, instead of the plurality of bridges 201, a plurality of electrical connections 113 may be used to effect the connection between the upper electrode 104 and a lower electrode 301 (depicted in FIG. 3B) of another electrical component (not shown).

Notably, the plurality of bridges 201 is disposed along a length L of the each of the interconnection sides 112. As described above, the improvements in electrical performance of the BAW resonator 300 are realized by the present teachings by replacing an electrical connection that extends along the entire length (L) with the plurality of bridges 201 that each have a width (w). The plurality of bridges 201 are spaced from each other by a spacing (s).

The sum of the widths (w) of the plurality of bridges 201 is often described as a percentage of the sum of the lengths of the sides of the upper electrode 104, or a percentage as its perimeter. While the width (w) of each of the plurality of bridges 201 may be the same, this is not necessarily the case. Moreover, the spacing (s) between each bridge 201 may be the same, this is also not essential. Finally, and as described more fully below, the number of bridges 201 is not limited to the three bridges 201 shown.

Like the plurality of electrical connections 113, reducing the total width (sum of nw, where n is the number of bridges 201) of the bridges 201 at the interconnection side 112 of first and second BAW resonators 200, 200', while beneficially providing improvement in $R_p$ (and $Q_p$) by reducing acoustic energy loss, results in an undesired increase in the parasitic resistance at $F_s$, $R_s$, which, as noted above, is beneficially maintained at a comparatively low value. It can be shown that the additional parasitic resistance ($R_s$) drops by a factor of (number of connections)$^{-1}$. By way of example, reducing the width of the electrical connection to a predetermined percentage of the total perimeter of the upper electrode 104 in one connection could result in an increase in $R_s$ by a certain factor of X$\Omega$. However, by providing three bridges 201, the total width of which (3w) is the predetermined percentage of the total perimeter of the upper electrode 104, the additional parasitic resistance $R_s$ is beneficially reduced to approximately 0.3X$\Omega$.

While further reductions in the parasitic resistance $R_s$ could be realized by further increasing the number of the plurality of bridges 201, the number is limited by a reduction in the $R_p$ (and $Q_p$) that can occur due to limits in photolithography. Specifically, it is believed that suitable improvements in $R_p$ (and $Q_p$) at an acceptable increase in $R_s$ are realized by providing between approximately two (a) and approximately six (6) bridges 201. At more than six bridges 201, it is believed that the acoustic physics at the interface of the upper electrode 104 and the plurality of bridges 201 is adversely impacted due to the shapes and dimensions of the bridges 201. This adverse impact on the physics is manifest in reductions in $R_p$ (and $Q_p$) that cannot be justified by the marginal decrease in $R_s$.

As can be appreciated, there is therefore, a tradeoff between the gains in $R_p$ (and $Q_p$) with the reduction in $R_s$ that plays a part in the determination of the number (n) of bridges 201 and the total width (nw) of the plurality of bridges 201 as a percentage of the total perimeter of the upper electrode 104. Generally, the number of bridges 201 is between three and five, and the total width (nw) of the plurality of bridges 201 as a percentage of the total perimeter of the upper electrode 104 is in the range of approximately 5% and approximately 25%.

Figure 3B:
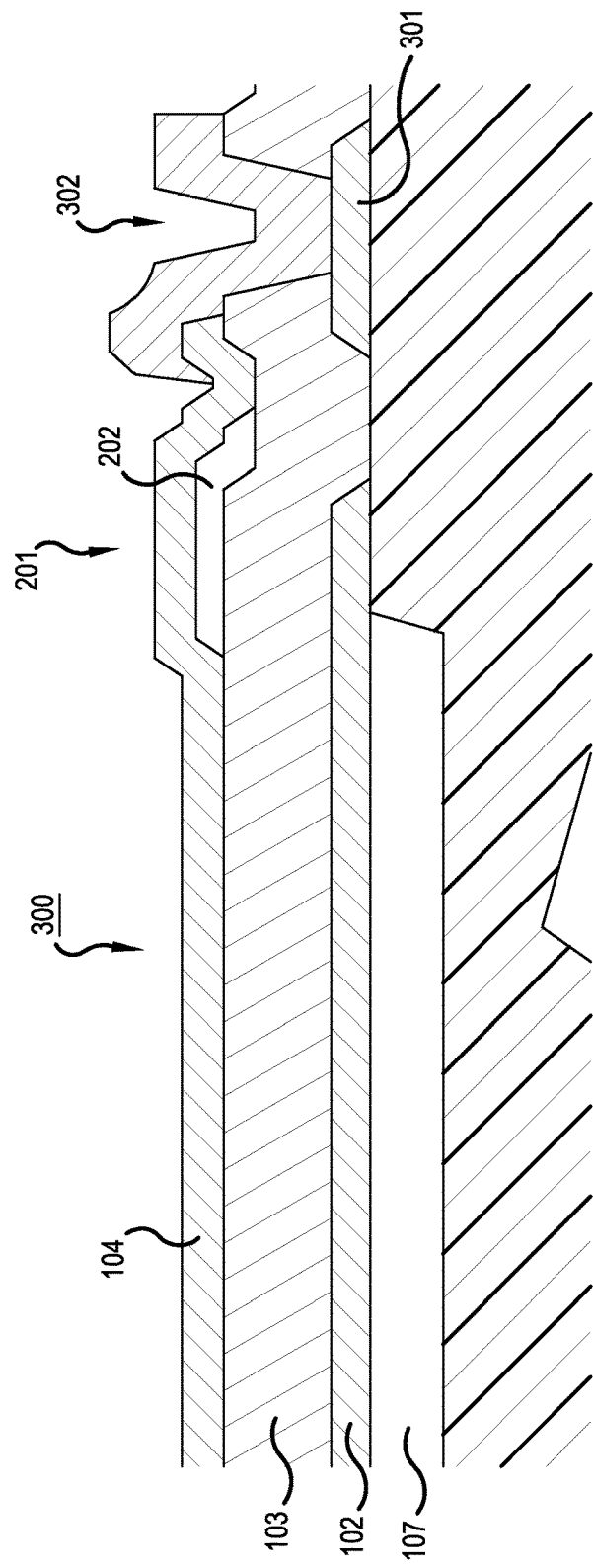
FIG. 3B is a cross-sectional view of the BAW resonator structure depicted in FIG. 3A.

FIG. 3B shows a cross-sectional view of BAW resonator 300 taken along line 3B-3B of FIG. 3A and in accordance with a representative embodiment. Many of the features of BAW resonator 300 are common to those of first BAW resonators 100, 200 described in connection with representative embodiments in FIGS. 1A-2B. The details of common features, characteristics and benefits thereof are not repeated in order to avoid obscuring the presently described embodiments.

The BAW resonator 300 comprises bridge 201 along the interconnection side 112. The bridge 201 provides a gap 202, which may be a void (e.g., air) or may be filled with a low acoustic impedance material. The bridge 201 is described in commonly owned U.S. Pat. Nos. 8,248,185 and 8,902,023, and as such many of the details of the bridge 201 are not repeated in the present application to avoid obscuring the description of the representative embodiments of the BAW resonator 300.

As can be appreciated, the BAW resonator 300 comprises an FBAR. It is emphasized that the BAW resonator 300 is merely illustrative, and SMRs are contemplated for use in the various apparatuses of the present teachings by replacing cavity 107 with, for example, an acoustic Bragg reflector.

As described above, the bridge 201 also provides an improvement in the Q-factor. Beneficially, the combination of the cantilevered portion 106 and the bridge 201 provides a further improvement in the Q-factor of the BAW resonator 300. To this end, inclusion of the bridge 201 with the cantilevered portion 106 in the BAW resonator 300 results in an improvement in the Q-factor at parallel resonance (Qp) and some impact on the Q-factor at series resonance (Qs). This is somewhat expected since the bridge 201 predominantly impacts Qp, as described in U.S. Pat. Nos. 8,248,185 and 8,902,023, referenced above.

As can be seen, bridge 201 is electrically connected to contact 302, which in turn is electrically connected to lower electrode 301, which is electrically connected to another BAW resonator (not shown) or a contact pad (not shown).

Figure 4:
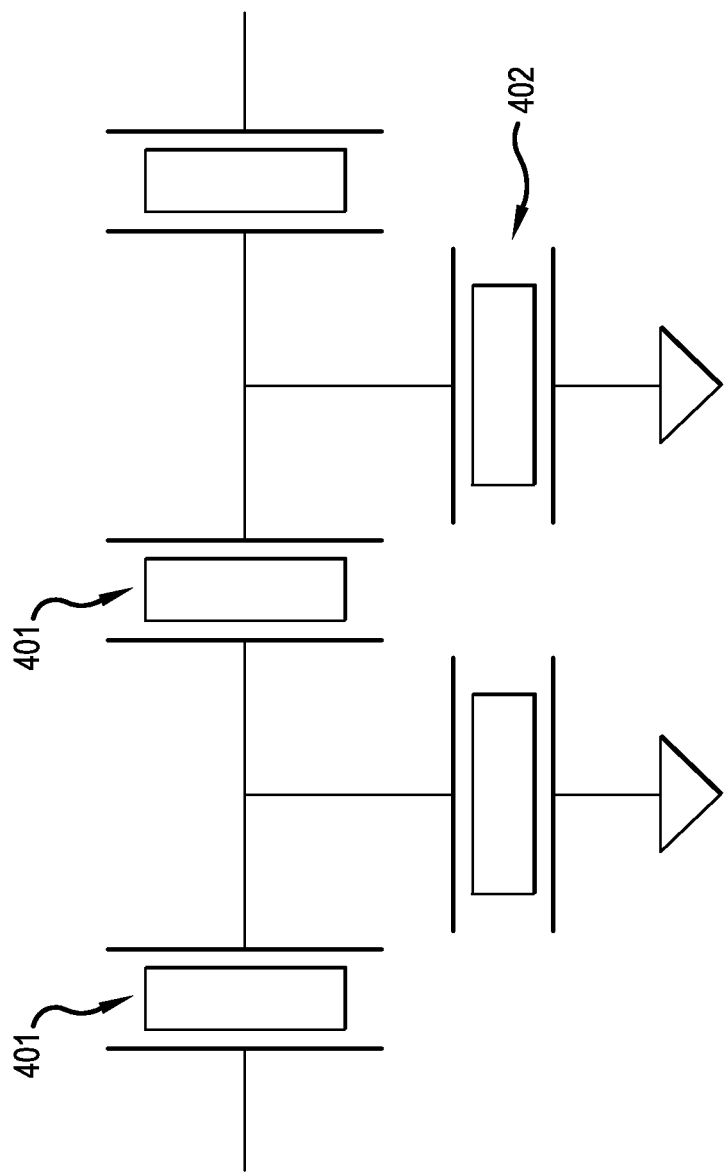
FIG. 4 shows a simplified schematic diagram of an electrical filter in accordance with a representative embodiment.

FIG. 4 shows a simplified schematic block diagram of an electrical filter 400 in accordance with a representative embodiment. The electrical filter 400 comprises series BAW resonators 401 and shunt BAW resonators 402. The series BAW resonators 401 and shunt BAW resonators 402 may comprise the first and second BAW resonators 100, 100', 200, 200' and 300 that are connected variously using a plurality of electrical connections 113, or a plurality of bridges 201, or both, described in connection with the representative embodiments of FIGS. 1A-3B. The electrical filter 400 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 400 is merely illustrative and other topologies are contemplated. Moreover, the acoustic resonators of the representative embodiments are contemplated in a variety of applications besides duplexers.

In accordance with illustrative embodiments, BAW resonator structures and BAW resonators for various applications such as in electrical filters are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

We claim:

1. A bulk acoustic wave (BAW) resonator, comprising:
   a lower electrode;
   an upper electrode comprising a connection side having a width;
   a piezoelectric layer disposed between the lower and upper electrodes;
   a reflective element disposed beneath the lower electrode, the upper electrode and the piezoelectric layer, an overlap of the reflective element, the lower electrode, the upper electrode and the piezoelectric layer defining an active area of the BAW resonator, wherein the lower electrode substantially covers the reflective element, and the piezoelectric layer extends over an edge of the lower electrode;
   a plurality of electrical connections disposed along the width of the connection side of the upper electrode, each of the plurality of electrical connections being disposed adjacent to a termination of the active area of the BAW resonator, wherein none of the plurality of electrical connections overlap.

2. A BAW resonator as claimed in claim 1, further comprising a plurality of spacings, wherein adjacent electrical connections are separated by one of the plurality of spacings.

3. A BAW resonator as claimed in claim 1, wherein each of the plurality of electrical connections comprises a bridge, which comprises a gap, and each of the plurality of bridges overlaps a portion of the lower electrode.

4. A BAW resonator as claimed in claim 3, wherein the gap comprises a region between the upper electrode and the piezoelectric layer.

5. A BAW resonator as claimed in claim 1, wherein the upper electrode comprises a plurality of non-connection sides, and at least one of the plurality of non-connection sides comprises a cantilevered portion.

6. A BAW resonator as claimed in claim 1, wherein the width is a first width, each of the plurality of electrical connections has a second width and each of the spacings comprises a third width.

7. A BAW resonator as claimed in claim 6, wherein the second width is substantially the same as the third width.

8. A BAW resonator as claimed in claim 6, wherein a sum of the second and third widths is substantially equal to the first width.

9. A BAW resonator as claimed in claim 1, further comprising a cantilevered portion between two of the plurality of electrical connections.

10. A BAW resonator as claimed in claim 9, further comprising a cantilevered portion between each of the plurality of electrical connections.

11. A BAW resonator as claimed in claim 1, wherein the reflective element comprises a cavity disposed in a substrate.

12. A BAW resonator as claimed in claim 1, wherein the reflective element comprises a Bragg mirror.

13. An electrical device, comprising:
   a first bulk acoustic wave (BAW) resonator, comprising:
      a first electrode; a second electrode comprising a connection side having a first width; a first piezoelectric layer disposed between the first and second electrodes; a reflective element disposed beneath the first electrode, the second electrode and the first piezoelectric layer, an overlap of the reflective element, the first electrode, the second electrode and the first piezoelectric layer defining an active area of the first BAW resonator, wherein the first electrode substantially covers the reflective element, and the first piezoelectric layer extends over an edge of the first electrode; and a plurality of electrical connections disposed along the first width of the connection side of the second electrode, each of the plurality of electrical connections being disposed adjacent to a termination of the active area of the first BAW resonator; and
   a second BAW resonator comprising a third electrode, a second piezoelectric layer, and a fourth electrode comprising a connection side having a second width, wherein the plurality of bridges extend between the second and fourth electrodes and are disposed along the second width of the connection side of the fourth electrode.

14. An electrical device as claimed in claim 13, wherein each of the plurality of electrical connections comprises a bridge, and each bridge comprises: a first gap comprising a region between the second electrode and the first piezoelectric layer; and a second gap between the fourth electrode and the second piezoelectric layer.

15. An electrical device as claimed in claim 13, wherein the second electrode and the fourth electrode each comprise a plurality of non-connection sides, and at least one of the plurality of non-connection sides comprises a cantilevered portion.

16. An electrical device as claimed in claim 13, wherein the second electrode and the fourth electrode each comprise respective upper surfaces with respective sides and a recess is disposed along each of the respective sides.

17. An electrical device as claimed in claim 13, wherein the second electrode and the fourth electrode each comprise respective upper surfaces with respective sides and a frame element is disposed along each of the respective sides.

18. An electrical device as claimed in claim 13, wherein each of the plurality of bridges has a third width and each of the plurality of bridges is separated by a respective spacing having a fourth width.

19. An electrical device as claimed in claim 18, wherein the third width is substantially the same as the fourth width.

20. An electrical device as claimed in claim 18, wherein a sum of the third and fourth widths is substantially equal to the first width, and substantially equal to the second width.

21. An electrical device as claimed in claim 13, further comprising a cantilevered portion between two of the plurality of electrical connections.

22. An electrical device as claimed in claim 13, further comprising a cantilevered portion between each of the plurality of electrical connections.

23. An electrical device as claimed in claim 13, wherein the reflective element comprises a cavity disposed in a substrate.

24. An electrical device as claimed in claim 13, wherein the reflective element comprises a Bragg mirror.

25. An electrical device as claimed in claim 13, wherein the reflective element is a first reflective element, the electrical device further comprising:
  a reflective element disposed beneath the second BAW resonator, the reflective element comprising one of a cavity or a Bragg mirror.

* * * * *